(12) United States Patent
Zhang

(10) Patent No.: US 9,112,539 B2
(45) Date of Patent: Aug. 18, 2015

(54) SYSTEMS AND METHODS FOR ITERATIVE DATA PROCESSING USING FEEDBACK ITERATION

(71) Applicant: LSI Corporation, Milpitas, CA (US)

(72) Inventor: Fan Zhang, Milpitas, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 267 days.

(21) Appl. No.: 13/654,417

(22) Filed: Oct. 18, 2012

(65) Prior Publication Data

US 2014/0115430 A1    Apr. 24, 2014

(51) Int. Cl.
*H03M 13/00* (2006.01)
*H03M 13/05* (2006.01)
*H03M 13/29* (2006.01)
*H03M 13/37* (2006.01)
*H03M 13/11* (2006.01)
*H03M 13/41* (2006.01)

(52) U.S. Cl.
CPC ........ *H03M 13/658* (2013.01); *H03M 13/2957* (2013.01); *H03M 13/3723* (2013.01); *H03M 13/6337* (2013.01); *H03M 13/6343* (2013.01); *H03M 13/1111* (2013.01); *H03M 13/4138* (2013.01)

(58) Field of Classification Search
None
See application file for complete search history.

(56) References Cited

U.S. PATENT DOCUMENTS

| 6,029,264 | A | 2/2000 | Kobayashi |
| 8,595,576 | B2* | 11/2013 | Yen ............................. 714/736 |
| 8,751,915 | B2* | 6/2014 | Zhang .......................... 714/795 |
| 2007/0201632 | A1 | 8/2007 | Ionescu |
| 2010/0042890 | A1 | 2/2010 | Gunnam et al. |
| 2012/0005551 | A1 | 1/2012 | Gunnam et al. |
| 2014/0050286 | A1* | 2/2014 | Dick ............................. 375/340 |
| 2014/0078608 | A1* | 3/2014 | Xiao et al. ..................... 360/45 |

OTHER PUBLICATIONS

Kang et al., "A Two-Stage Iterative Decoding of LDPC Codes for Lowering Error Floors", IEEE Globecom Proceedings, 1088-1091 (2008).
Lin et al "An efficient VLSI Architecture for non binary LDPC decoders"—IEEE Transaction on Circuits and Systems II vol. 57, Issue 1 (Jan. 2010) pp. 51-55.
Perisa et al "Frequency Offset Estimation Based on Phase Offsets Between Sample Correlations" Dept. of Info. Tech. University of Ulm 2005.
U.S. Appl. No. 13/452,733, filed Apr. 20, 2012, Shaohua Yang, Unpublished.
U.S. Appl. No. 13/426,722, filed Mar. 22, 2012, Fan Zhang, Unpublished.
U.S. Appl. No. 13/450,289, filed Apr. 18, 2012, Shaohua Yang, Unpublished.

(Continued)

*Primary Examiner* — Justin R Knapp
(74) *Attorney, Agent, or Firm* — Hamilton DeSanctis & Cha

(57) ABSTRACT

Systems and methods for data processing. In one case, a data processing system includes a data detector circuit configured to apply a data detection algorithm to a detector input to yield a second detected output, and a data decoder circuit configured to apply a data decoding algorithm to a decoder input to yield a decoded output. The decoder input is derived from an interim data set calculated as a combination of at least a first detected output and the second detected output.

21 Claims, 4 Drawing Sheets

(56) References Cited

OTHER PUBLICATIONS

U.S. Appl. No. 13/363,751, filed Feb. 1, 2012, Lei Chen, Unpublished.

U.S. Appl. No. 13/284,754, filed Oct. 28, 2011, Fan Zhang, Unpublished.

* cited by examiner

SYSTEMS AND METHODS FOR ITERATIVE DATA PROCESSING USING FEEDBACK ITERATION

BACKGROUND

Various embodiments are related to systems and methods for data processing, and more particularly to systems and methods for selectable positive feedback data processing.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. As data is passed between the data detector circuit and the data decoder circuit, the receiving circuit may actually make things worse. This results in unnecessary additional iterations through the data processing circuit.

Hence, for at least the aforementioned reasons, there exists a need in the art for advanced systems and methods for enhanced data processing.

BRIEF SUMMARY

Various embodiments are related to systems and methods for data processing, and more particularly to systems and methods for selectable positive feedback data processing.

Various embodiments of the present invention provide data processing systems that include: a data detector circuit and a data decoder circuit. The data decoder circuit is operable to apply a data decoding algorithm to a decoder input to yield a decoded output. The data detector circuit is operable to apply a data detection algorithm to a detector input to yield a first detected output, and to apply the data detection algorithm to the detector input guided by a derivative of the decoded output to yield a second detected output. The decoder input is derived from an interim data set calculated as a combination of at least the first detected output and the second detected output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION

Figure 1:
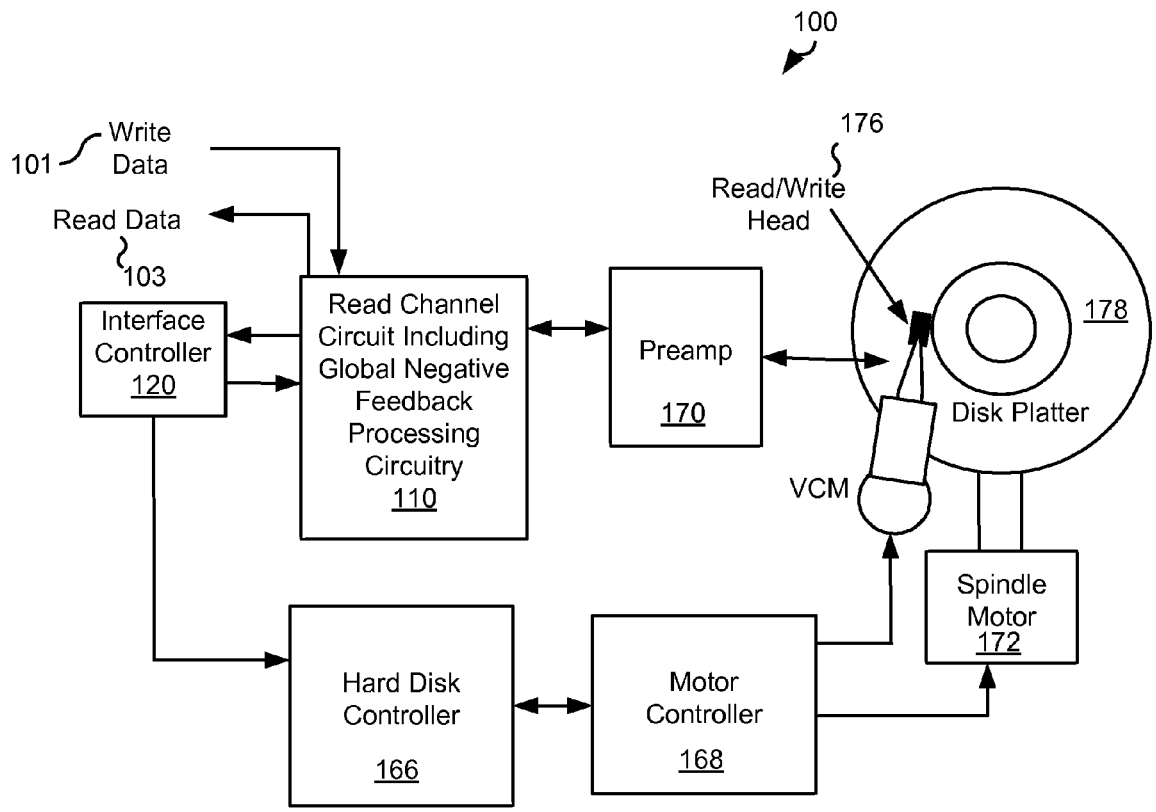
FIG. 1 shows a storage system including global negative feedback processing circuitry in accordance with various embodiments of the present invention.

Various embodiments are related to systems and methods for data processing, and more particularly to systems and methods for selectable positive feedback data processing.

Various embodiments of the present invention include a data processing circuit having a data detector circuit and a data decoder circuit. In general, a data set is processed through the data detector circuit, and the result from processing through the data detector circuit is processed through the data decoder circuit. Processing through both the data detector circuit and the data decoder circuit is referred to herein as a "global iteration". During any global iteration, the result of processing through the data detector circuit may be repeatedly reprocessed through the data decoder circuit. Each time processing through the data decoder circuit during a given global iteration is referred to herein as a "local iteration". In the aforementioned embodiments, negative feedback on a global iteration basis is utilized to enhance the data processing.

As a particular example of the aforementioned embodiments, the data detector circuit applies a data detection algorithm to a detector input to yield a detected output. Where available, the data detection algorithm is guided by a negative feedback decoded output from a preceding global iteration. The resulting detected output is modified by a negative feedback value that corresponds to the detected output from one or more preceding global iterations. This modified detected output is referred to as a negative feedback modified detected output. The data decoder circuit applies a data decode algorithm to a derivative of the negative feedback modified detected output to yield a decoded output. Where available, the decode algorithm may be guided by a previous decoded output. Where the data decode algorithm fails to converge, the negative feedback modified detected output is subtracted from the decoded output to yield the aforementioned negative feedback modified decoded output.

Various embodiments of the present invention provide data processing systems that include: a data detector circuit and a data decoder circuit. The data decoder circuit is operable to apply a data decoding algorithm to a decoder input to yield a decoded output. The data detector circuit is operable to apply a data detection algorithm to a detector input to yield a first detected output, and to apply the data detection algorithm to the detector input guided by a derivative of the decoded output to yield a second detected output. The decoder input is derived from an interim data set calculated as a combination of at least the first detected output and the second detected output. In some instances of the aforementioned embodiments, the derivative of the decoded output is calculated by subtracting the decoder input from the decoded output. In various cases, the data detector circuit is a Viterbi algorithm data detector circuit. In other cases, the data detector circuit is a maximum a posteriori data detector circuit. In one or more cases, the data decoder circuit is a low density parity check decoder circuit. In some instances of the aforementioned embodiments, the system is implemented as an integrated circuit. The system may be incorporated in, for example, a storage device or a data transmission device.

In some instances of the aforementioned embodiments, the interim data set is calculated by: subtracting the derivative of the decoded output from the second detected output to yield a sum; multiplying the first detected output by a first scalar to yield a first product; multiplying the sum by a second scalar to yield a second product; and subtracting the first product from the second product to yield the interim data set. In Various instances of the aforementioned embodiments, the decoder input is a first decoder input and the decoded output is a first decoded output. In some such instances, the data decoder circuit is further operable to apply the data decoding algorithm to a second decoder to yield a second decoded output, and the data detector circuit is further operable to apply the data detection algorithm to the detector input guided by a derivative of the second decoded output to yield a third detected output. The second decoder input is derived from a combination of at least the first detected output, a negative feedback modification of the second detected output, and the third detected output. In some such instances, the negative feedback modification of the second detected output is calculated by: subtracting the derivative of the decoded output from the second detected output to yield a sum; multiplying the first detected output by a first scalar to yield a first product; multiplying the sum by a second scalar to yield a second product; and subtracting the first product from the second product to yield the negative feedback modification of the second detected output. In one or more such instances, the interim data set is calculated by: subtracting the derivative of the second decoded output from the second detected output to yield a sum; detector input from the third detected output to yield a sum; multiplying the negative feedback modification of the first detected output by a first scalar to yield a first product; multiplying the negative feedback modification of the second detected output by a second scalar to yield a second product; multiplying the sum by a third scalar to yield a third product; and subtracting the first product and the second product from the third product to yield the interim data set.

Other embodiments of the present invention provide methods for data processing that include: applying a data detection algorithm by a data detector circuit to a detector input to yield a first detected output; applying a data decoding algorithm to a decoder input to yield a decoded output; applying the data detection algorithm to the detector input guided by a derivative of the decoded output to yield a second detected output; and calculating an interim data set based at least in part on the first detected output, and the second detected output, wherein the decoder input is derived from the interim data set. In some such embodiments, calculating the interim data set includes: subtracting the derivative of the decoded output from the second detected output to yield a sum; multiplying the first detected output by a first scalar to yield a first product; multiplying the sum by a second scalar to yield a second product; and subtracting the first product from the second product to yield the interim data set.

Turning to FIG. 1, a storage system 100 including a read channel circuit 110 having global negative feedback processing circuitry in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a data processing circuit having a data detector circuit and a data decoder circuit. The data detector circuit applies a data detection algorithm to a detector input to yield a detected output. Where available, the data detection algorithm is guided by a negative feedback decoded output from a preceding global iteration. The resulting detected output is modified by a negative feedback value. The negative feedback value corresponds to the detected output from one or more preceding global iterations. This modified detected output is referred to as a negative feedback modified detected output. The data decoder circuit applies a data decode algorithm to a derivative of the negative feedback modified detected output to yield a decoded output. Where available, the decode algorithm may be guided by a previous decoded output. Where the data decode algorithm fails to converge, the negative feedback modified detected output is subtracted from the decoded output to yield the aforementioned negative feedback modified decoded output. In some cases, read channel circuit 110 may be implemented to include a data processing circuit similar to that discussed below in relation to FIG. 3. Further, the data processing may be accomplished consistent with one of the approaches discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
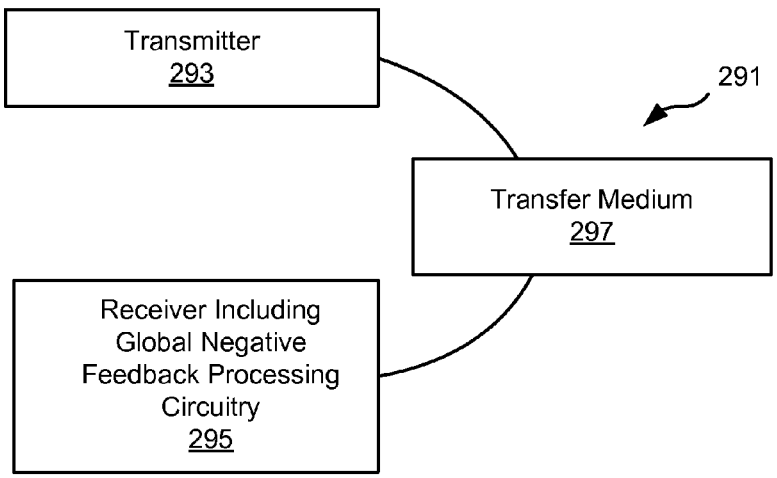
FIG. 2 depicts a data transmission system including global negative feedback processing circuitry in accordance with one or more embodiments of the present invention.

Turning to FIG. 2, a data transmission system 291 including a receiver 295 having global negative feedback processing circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data. As part of processing the received information, receiver 295 utilizes a data processing circuit having a data detector circuit and a data decoder circuit. The data detector circuit applies a data detection algorithm to a detector input to yield a detected output. Where available, the data detection algorithm is guided by a negative feedback decoded output from a preceding global iteration. The resulting detected output is modified by a negative feedback value. The negative feedback value corresponds to the detected output from one or more preceding global iterations. This modified detected output is referred to as a negative feedback modified detected output. The data decoder circuit applies a data decode algorithm to a derivative of the negative feedback modified detected output to yield a decoded output. Where available, the decode algorithm may be guided by a previous decoded output. Where the data decode algorithm fails to converge, the negative feedback modified detected output is subtracted from the decoded output to yield the aforementioned negative feedback modified decoded output. In some cases, receiver 295 may be implemented to include a data processing circuit similar to that discussed below in relation to FIG. 3. Further, the data processing may be accomplished consistent with one of the approaches discussed below in relation to FIGS. 4a-4b.

Figure 3:
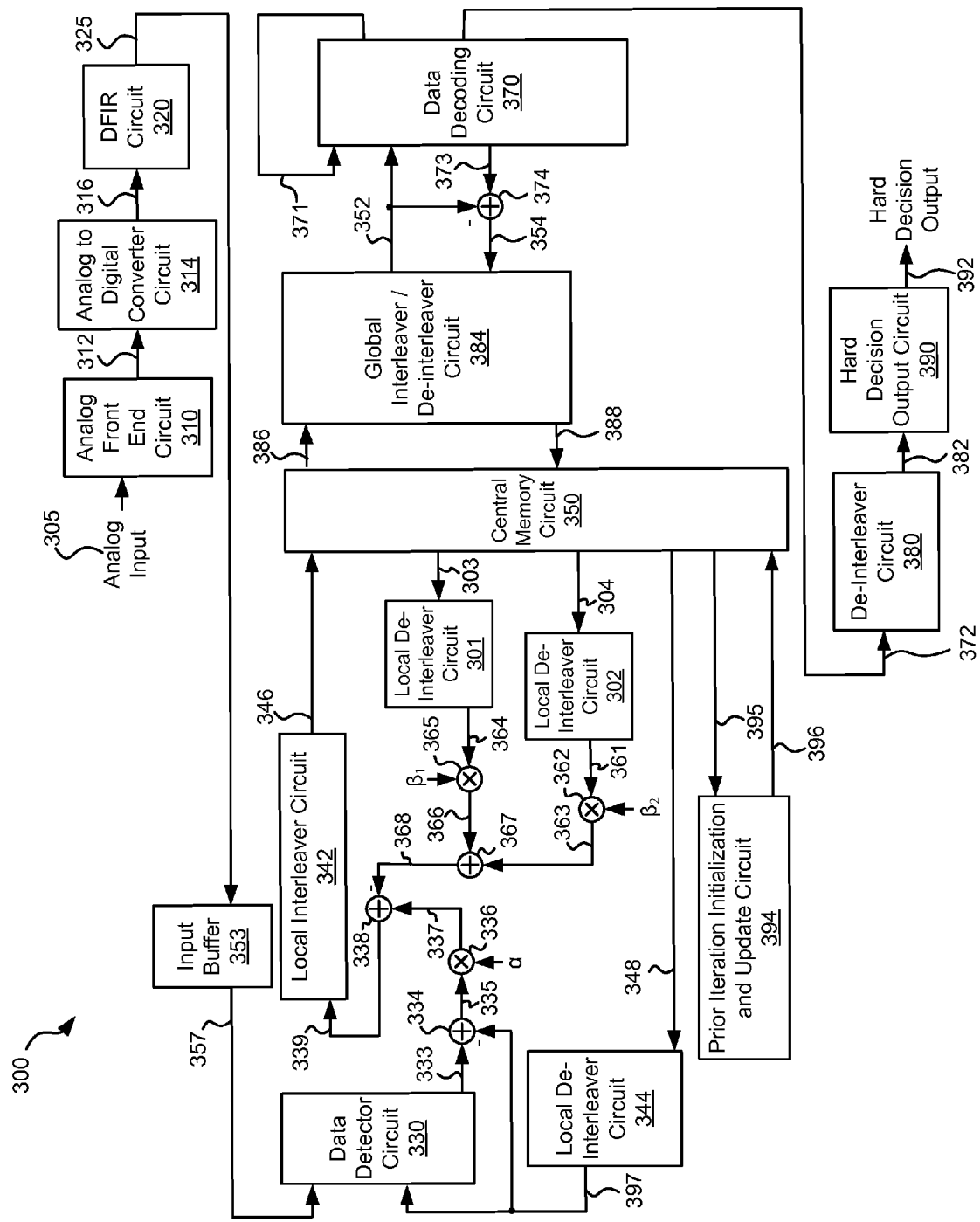
FIG. 3 shows a data processing circuit including global negative feedback processing circuitry in accordance with some embodiments of the present invention.

FIG. 3 shows a data processing circuit 300 including global negative feedback processing circuitry in accordance with some embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter (DFIR) circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain one or more codewords until processing of that codeword is completed through a data detector circuit 330 and a data decoding circuit 370 including, where warranted, multiple global iterations (passes through both data detector circuit 330 and data decoding circuit 370) and/or local iterations (passes through data decoding circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides detected output 333 that includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 333 is provided to a summation circuit 334 that subtracts a de-interleaved output 397 (La(i)) from detected output 333 (Lt(i)) to yield a sum 335 in accordance with the following equation:

sum $335 = Lt(i) - La(i)$, where i is an index indicating a global iteration of a given data set. In particular, 'i' indicates the most recently available data set, 'i−1' indicates a data set from the prior global iteration, 'i−2' indicates a data set from the next prior global iteration. De-interleaved output 397 is derived the result of application of a data decode algorithm by data decoding circuit 370. Sum 335 is provided to a multiplier circuit 336 where it is multiplied by a scalar α to yield a product 337 in accordance with the following equation:

product $337 = \alpha * \text{sum } 335 = \alpha * [Lt(i) - La(i)]$, where scalar α is a positive number between zero and one.

A codeword 303 from a prior global iteration (i.e., codeword (i−1)) corresponding to detected output 333 (Lt(i)) is accessed from a central memory circuit 350 and de-interleaved by a local de-interleaver circuit 301 to yield a detected output 364 (Le(i−1)). Local de-interleaver circuit 301 is the same circuit as local de-interleaver circuit 302 and local de-interleaver circuit 344. In each case, the local de-interleaving applied re-arranges the respective input data set (i.e., codeword 301, a codeword 303, and a decoder output 348, respectively) to reverse the shuffling originally performed by an interleaver circuit 342. Similarly, a codeword 304 from a next prior global iteration (i.e., codeword (i−2)) corresponding to detected output 333 (Lt(i)) is accessed from central memory circuit 350 and de-interleaved by a local de-interleaver circuit 301 to yield a detected output 361 (Le(i−2)). A prior iteration initialization and update circuit 394 receives an iteration completion indication signal 395 from central memory circuit 394 indicating that a codeword 346 is to be written to central memory circuit 350. In response, prior iteration initialization and update circuit 394 asserts a codeword update signal 396 to cause the previously written codeword to be maintained in central memory circuit 350 as codeword 303, and for the previous version of codeword 303 to be maintained in central memory circuit 350 as codeword 304. For a first global iteration, prior iteration initialization and update circuit 394 asserts codeword update signal 396 to cause codeword 303 and codeword 304 to be initialized to zeros. In the second global iteration, codeword 304 is set equal to the zeros in codeword 303, and codeword 303 is set equal to codeword 346 from the first global iteration. This process of updating continues until all global iterations for a particular output 357 are exhausted at which time the codewords corresponding to the respective output 357 are re-initialized to zeros.

Detected output 364 is provided to a multiplier circuit 365 where it is multiplied by a scalar $\beta_1$ to yield a product 366 in accordance with the following equation:

product $366 = \beta_1 * Le(i-1)$, where scalar $\beta_1$ is a positive number between zero and one. Similarly, detected output 361 is provided to a multiplier circuit 362 where it is multiplied by a scalar $\beta_2$ to yield a product 363 in accordance with the following equation:

product $363 = \beta_2 * Le(i-2)$, where scalar $\beta_2$ is a positive number between zero and one. Product 366 and product 363 are provided to a summation circuit 367 where they are added together to yield a sum 368 in accordance with the following equation:

sum $368 = \text{product } 366 + \text{product } 363 = \beta_1 * Le(i-1) + \beta_2 * Le(i-2)$.

Sum 368 is provided to a summation circuit 338 where it is subtracted from product 337 to yield a sum 339 in accordance with the following equation:

sum $339 = \text{product } 337 - \text{sum } 368 = \alpha * [Lt(i) - La(i)] - [\beta_1 * Le(i-1) + \beta_2 * Le(i-2)]$.

Sum 339 is provided to local interleaver circuit 342. Local interleaver circuit 342 is operable to shuffle sub-portions (i.e., local chunks) of the data set included as sum 339 and to provide an interleaved codeword 346 that is stored to central memory circuit 350. Interleaver circuit 342 may be any circuit known in the art that is capable of shuffling data sets to yield a re-arranged data set. As previously mentioned, upon writing codeword 346 to central memory circuit 350, prior iteration initialization and update circuit 394 asserts a codeword update signal 396 to cause the previously written codeword 346 to be maintained in central memory circuit 350 as codeword 303, and for the previous version of codeword 303 to be maintained in central memory circuit 350 as codeword 304. This process of updating continues until all global iterations for a particular output 357 are exhausted at which time the codewords corresponding to the respective output 357 are re-initialized to zeros.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 (La'(i)) into data decoding circuit 370. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass trough data decoder circuit 370) is desired, data decoding circuit 370 re-applies the data decode algorithm to decoder input 352 guided by decoded output 371. This continues until either a maximum number of local iterations is exceeded or decoded output 371 converges.

Where decoded output 371 fails to converge (i.e., fails to yield the originally written data set) and a number of local iterations through data decoder circuit 370 exceeds a threshold, a resulting decoded output 373 (Lt'(i)) is provided to a summation circuit 374 that subtracts decoder input (La'(i)) to yield a decoded output 354 in accordance with the following equation:

$$\text{decoded output } 354 = Lt'(i) - La'(i).$$

Decoded output 354 is written back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 accessed from central memory circuit 350 and locally de-interleaved by de-interleaver circuit 344. As previously mentioned, de-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

Figure 4A:
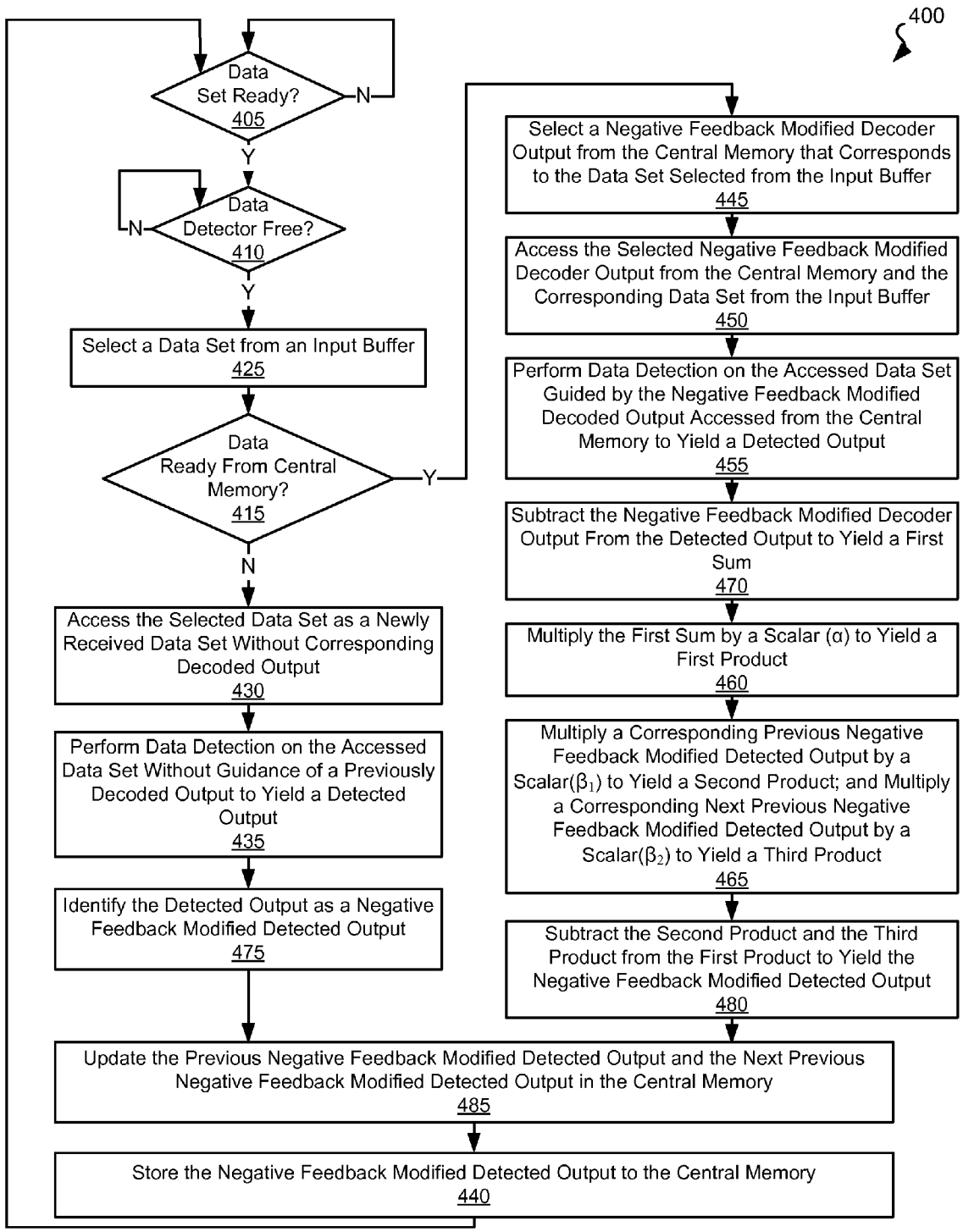
FIGS. 4a-4b are flow diagrams showing a method for data processing using global negative feedback in accordance with some embodiments of the present invention.

FIG. 4a is a flow diagram 400 showing a method for data processing using global negative feedback in accordance with some embodiments of the present invention. Following flow diagram 400, it is repeatedly determined whether a data set is ready for processing (block 405). A data set may become ready for processing where either the data set was previously processed and a data decode has completed in relation to the data set and the respective decoded output is available in a central memory, or where a previously unprocessed data set becomes available in an input buffer. The data sets may be received, for example, from a storage medium or a communication medium. In some cases, the data set is a sector of data. Where a data set is ready (block 405), it is determined whether a data detector circuit is available to process the data set (block 410).

Where the data detector circuit is available for processing (block 410), a data set from the input buffer is selected for processing (block 425). It is determined whether a negative feedback modified decoded output corresponding to the selected data set is available in the central memory (block 415). Such a corresponding negative feedback modified decoded output will be available for the second and later global iterations, but is not available for the first global iteration as the data decoding process has not yet been applied to yield the corresponding negative feedback modified decoded output.

Where a negative feedback modified decoded output corresponding to the selected data set is not available in the central memory (block 415), the selected data set is accessed as a newly received data set without a corresponding negative feedback modified decoded output (block 430), and a data detection algorithm is applied to the newly received data set (i.e., the first global iteration of the data set) without guidance of a previously decoded output to yield a detected output (block 435). In some cases, the data detection algorithm is a Viterbi algorithm data detector circuit or a maximum a posteriori data detector circuit. As this is the first global iteration for the processing data set, no data is available to modify the detected output using negative feedback. As such, the detected output is identified as a negative feedback modified detected output without any modification (block 475).

Alternatively, where a negative feedback modified decoded output corresponding to the selected data set is available in the central memory (i.e., for the second and later global iterations (block 415), the negative feedback modified decoder output (La(i)) corresponding to the data set selected from the input buffer is selected from the central memory circuit (block 445). The selected negative feedback modified decoder output (La(i)) is accessed from the central memory and the selected data set is accessed from the input buffer (block 450). The data detection algorithm is applied to the accessed data set (i.e., the second or later global iteration of the data set) guided by the accessed negative feedback modified decoder output (La(i)) to yield a detected output (block 455).

The negative feedback modified decoder output (La(i)) is subtracted from the detected output (Lt(i)) to yield a first sum in accordance with the following equation:

$$\text{First Sum} = Lt(i) - La(i),$$

where i is an index indicating a global iteration of a given data set (block 470). In particular, 'i' indicates the most recently available data set, 'i−1' indicates a data set from the prior global iteration, 'i−2' indicates a data set from the next prior global iteration. The first sum is then multiplied by a scalar α to yield a first product in accordance with the following equation:

$$\text{First Product} = \text{First Sum} = \alpha*[Lt(i) - La(i)],$$

where scalar α is a positive number between zero and one (block 460).

In addition, the previous negative feedback modified detected output (Le(i−1)) corresponding to the selected data set is accessed from the central memory and multiplied by a scalar $\beta_1$ to yield a second product in accordance with the following equation:

$$\text{Second Product} = \beta_1 * Le(i-1),$$

where scalar $\beta_1$ is a positive number between zero and one; and the next previous negative feedback modified detected output ($Le(i-2)$) corresponding to the selected data set is accessed from the central memory and multiplied by a scalar $\beta_2$ to yield a third product in accordance with the following equation:

$$\text{Third Product} = \beta_2 * Le(i-2),$$

where scalar $\beta_2$ is a positive number between zero and one (block 465). The second and third products are both subtracted from the first product to yield the negative feedback modified detected output in accordance with the following equation:

$$\text{Negative Feedback Modified Detected Output} = \alpha * [Lt(i) - La(i)] - [\beta_1 * Le(i-1) + \beta_2 * Le(i-2)]$$

(block 480).

The previous negative feedback modified detected output and the next previous negative feedback modified detected output are updated in the central memory in accordance with the following equations:

$$Le(i-2) = Le(i-1); \text{ and}$$

$$Le(i-1) = Le(i)$$

(block 485). The current negative feedback modified detected output (or some derivative thereof) is then stored to the central memory to await processing by a data decoder circuit (block 440).

Figure 4B:
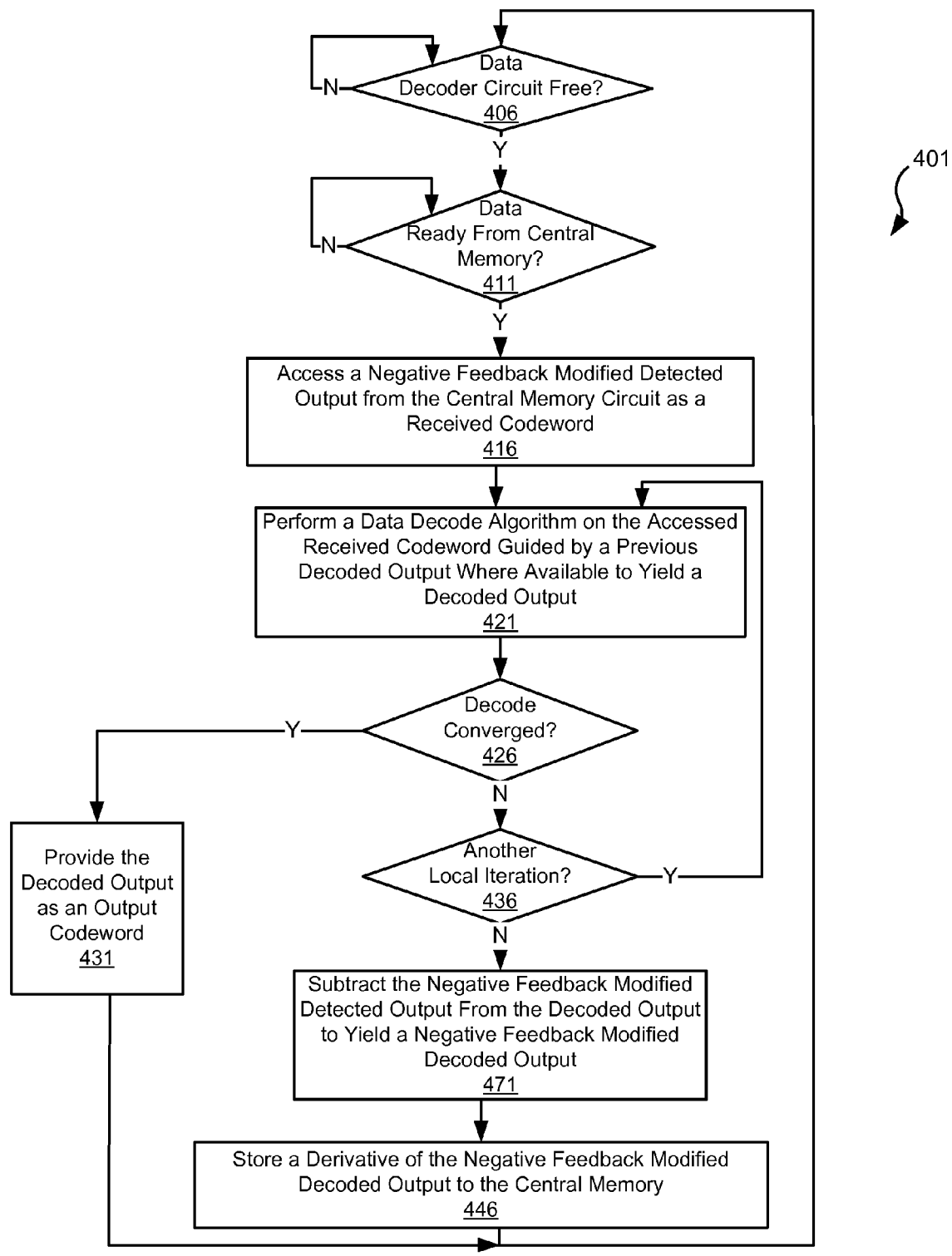

Turning to FIG. 4b, a flow diagram 401 shows a counterpart of the method described above in relation to FIG. 4a. Following flow diagram 401, in parallel to the previously described data detection process of FIG. 4a, it is determined whether a data decoder circuit is available (block 406). The data decoder circuit may be, for example, a low density data decoder circuit as are known in the art. Where the data decoder circuit is available (block 406), it is determined whether a negative feedback modified detected output (or a derivative thereof) is available for processing in the central memory (block 411). Where such a data set is ready (block 411), the previously stored negative feedback modified detected output is accessed from the central memory and used as a received codeword (block 416).

A data decode algorithm is applied to the received codeword to yield a decoded output (block 421). Where a previous local iteration has been performed on the received codeword, the results of the previous local iteration (i.e., a previous decoded output) are used to guide application of the decode algorithm. It is then determined whether the decoded output converged (i.e., resulted in the originally written data) (block 426). Where the decoded output converged (block 426), it is provided as an output codeword (block 431). Alternatively, where the decoded output failed to converge (block 426), it is determined whether another local iteration is desired (block 436). In some cases, ten local iterations are allowed per each global iteration. Based upon the disclosure provided herein, one of ordinary skill in the art will recognize another number of local iterations that may be used in relation to different embodiments of the present invention. Where another local iteration is desired (block 436), the processes of blocks 421-436 are repeated for the codeword. Alternatively, where another local iteration is not desired (block 436), the negative feedback modified detected output is subtracted from the decoded output to yield a negative feedback modified decoded output (block 471), and the negative feedback modified decoded output is stored to the central memory to await a subsequent global iteration (see block 455 of FIG. 4a) (block 446).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for priority based data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data decoder circuit configured to:
        apply a data decoding algorithm to a first decoder input to yield a first decoded output; and
        apply the data decoding algorithm to a second decoder input to yield a second decoded output;
    a data detector circuit configured to:
        provide a first detected output;
        apply a data detection algorithm to a detector input guided by a derivative of the first decoded output to yield a second detected output; and
    wherein the second decoder input is derived from an interim data set calculated as a combination of at least a first detected output and the second detected output.

2. The data processing system of claim 1, wherein the interim data set is calculated by:
    subtracting the derivative of the first decoded output from the second detected output to yield a sum;
    multiplying the first detected output by a first scalar to yield a first product;
    multiplying the sum by a second scalar to yield a second product; and
    subtracting the first product from the second product to yield the interim data set.

3. The data processing system of claim 1, wherein the data detector circuit is further configured to apply the data detection algorithm to the detector input guided by a derivative of the second decoded output to yield a third detected output; and wherein a third decoder input is derived from a combination of at least the first detected output, a negative feedback modification of the second detected output, and the third detected output.

4. The data processing system of claim 3, wherein the negative feedback modification of the second detected output is calculated by:
 subtracting the derivative of the second decoded output from the second detected output to yield a sum;
 multiplying the first detected output by a first scalar to yield a first product;
 multiplying the sum by a second scalar to yield a second product; and
 subtracting the first product from the second product to yield the negative feedback modification of the second detected output.

5. The data processing system of claim 3, wherein the interim data set is calculated by:
 subtracting the derivative of the second decoded output from the second detected output to yield a sum;
 multiplying the negative feedback modification of the first detected output by a first scalar to yield a first product;
 multiplying the negative feedback modification of the second detected output by a second scalar to yield a second product;
 multiplying the sum by a third scalar to yield a third product; and
 subtracting the first product and the second product from the third product to yield the interim data set.

6. The data processing system of claim 1, wherein the derivative of the decoded output is calculated by subtracting the first decoder input from the first decoded output.

7. The data processing system of claim 1, wherein the data detector circuit is selected from a group consisting of: a Viterbi algorithm data detector circuit, and a maximum a posteriori data detector circuit.

8. The data processing system of claim 1, wherein the data decoder circuit is a low density parity check decoder circuit.

9. The data processing system of claim 1, wherein the system is implemented as an integrated circuit.

10. The data processing system of claim 1, wherein the system is incorporated in a device selected from a group consisting of: a storage device, and a data transmission device.

11. The data processing system of claim 1, wherein the detector input is a first detector input, and wherein the data detector circuit is further configured to apply the data detection algorithm to the a first detector input to yield the first detected output.

12. A method for data processing, the method comprising:
 applying a data detection algorithm by a data detector circuit to a detector input to yield a first detected output;
 applying a data decoding algorithm to a decoder input to yield a decoded output;
 applying the data detection algorithm to the detector input guided by a derivative of the decoded output to yield a second detected output; and
 calculating an interim data set based at least in part on the first detected output, and the second detected output, wherein the decoder input is derived from the interim data set.

13. The method of claim 12, wherein calculating the interim data set comprises:
 subtracting the derivative of the decoded output from the second detected output to yield a sum;
 multiplying the first detected output by a first scalar to yield a first product;
 multiplying the sum by a second scalar to yield a second product; and
 subtracting the first product from the second product to yield the interim data set.

14. The method of claim 12, wherein the decoder input is a first decoder input; wherein the decoded output is a first decoded output; wherein the method further comprises:
 applying the data decoding algorithm to a second decoder input to yield a second decoded output; and
 applying the data detection algorithm to the detector input guided by a derivative of the second decoded output to yield a third detected output; and
 calculating the interim data set based at least in part on the first detected output, a negative feedback modification of the second detected output, and the third detected output.

15. The method of claim 14, wherein the negative feedback modification of the second detected output is calculated by:
 subtracting the derivative of the decoded output from the second detected output to yield a sum;
 multiplying the first detected output by a first scalar to yield a first product;
 multiplying the sum by a second scalar to yield a second product; and
 subtracting the first product from the second product to yield the negative feedback modification of the second detected output.

16. The method of claim 14, wherein calculating the interim data set comprises:
 subtracting the derivative of the second decoded output from the second detected output to yield a sum;
 multiplying the negative feedback modification of the first detected output by a first scalar to yield a first product;
 multiplying the negative feedback modification of the second detected output by a second scalar to yield a second product;
 multiplying the sum by a third scalar to yield a third product; and
 subtracting the first product and the second product from the third product to yield the interim data set.

17. The method of claim 12, wherein the derivative of the decoded output is calculated by subtracting the decoder input from the decoded output.

18. The method of claim 12, wherein the data detector circuit is selected from a group consisting of: a Viterbi algorithm data detector circuit, and a maximum a posteriori data detector circuit.

19. The method of claim 12, wherein the data decoder circuit is a low density parity check decoder circuit.

20. A storage device, the storage device comprising:
 a storage medium;
 a head assembly disposed in relation to the storage medium and configured to provide a sensed signal corresponding to information on the storage medium;
 a read channel circuit including:
 an analog to digital converter circuit configured to sample an analog signal derived from the sensed signal to yield a series of digital samples;
 an equalizer circuit configured to equalize the digital samples to yield a data set;
 a data detector circuit configured to apply a data detection algorithm to a the data set to yield a first detected output;
 a data decoder circuit configured to apply a data decoding algorithm to a decoder input to yield a decoded output;
 wherein the data detector circuit is further configured to apply the data detection algorithm to the detector input guided by a derivative of the decoded output to yield a second detected output; and
 wherein the decoder input is derived from an interim data set calculated as a combination of at least the first detected output and the second detected output.

21. The storage device of claim 20, wherein the interim data set is calculated by:
   subtracting the derivative of the decoded output from the second detected output to yield a sum;
   multiplying the first detected output by a first scalar to yield a first product;
   multiplying the sum by a second scalar to yield a second product; and
   subtracting the first product from the second product to yield the interim data set.

* * * * *